(12) United States Patent
Ohsawa

(10) Patent No.: US 7,208,780 B2
(45) Date of Patent: Apr. 24, 2007

(54) SEMICONDUCTOR STORAGE DEVICE

(75) Inventor: Takashi Ohsawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/390,061

(22) Filed: Mar. 28, 2006

(65) Prior Publication Data

US 2006/0163634 A1    Jul. 27, 2006

Related U.S. Application Data

(62) Division of application No. 10/844,385, filed on May 13, 2004, now Pat. No. 7,075,152.

(30) Foreign Application Priority Data

Mar. 1, 2004   (JP)   ............................. 2004-056298

(51) Int. Cl.
*H01L 27/10*   (2006.01)

(52) U.S. Cl. ...................... 257/208; 257/202; 257/296; 257/347

(58) Field of Classification Search ................ 257/296, 257/208, 202, 347
See application file for complete search history.

(56) References Cited

U.S. PATENT DOCUMENTS

| | | | |
|---|---|---|---|
| 5,656,845 A | 8/1997 | Akbar | |
| 6,538,916 B2 | 3/2003 | Ohsawa | |
| 6,617,651 B2 | 9/2003 | Ohsawa | |
| 6,621,725 B2 | 9/2003 | Ohsawa | |
| 6,624,459 B1 | 9/2003 | Dachtera et al. | |
| 6,778,424 B2 | 8/2004 | Iwata et al. | |
| 6,815,282 B2 | 11/2004 | Dachtera et al. | |
| 6,873,539 B1 * | 3/2005 | Fazan et al. ................. | 365/149 |

FOREIGN PATENT DOCUMENTS

JP          2003-68877           3/2003

* cited by examiner

*Primary Examiner*—Doug Menz
(74) *Attorney, Agent, or Firm*—Oblon, Spivak, McClelland, Maier & Neustadt, P.C.

(57) ABSTRACT

A semiconductor storage device includes a semiconductor substrate; an sulating layer formed on the semiconductor substrate; a first semiconductor layer formed on the insulating layer and insulated from the semiconductor substrate; memory cells each having a source region of a first conduction type and a drain region of the first conduction type both formed in the first semiconductor layer, and having a body of a second conduction type formed in the first semiconductor layer between the source region and the drain region, the memory cells being capable of storing data by accumulating or releasing electric charge in or from their respective body regions; memory cell lines each including a plurality of the memory cells aligned in the channel lengthwise direction; and a memory cell array including a plurality of the memory cell lines aligned in a channel widthwise direction of the memory cells.

5 Claims, 7 Drawing Sheets

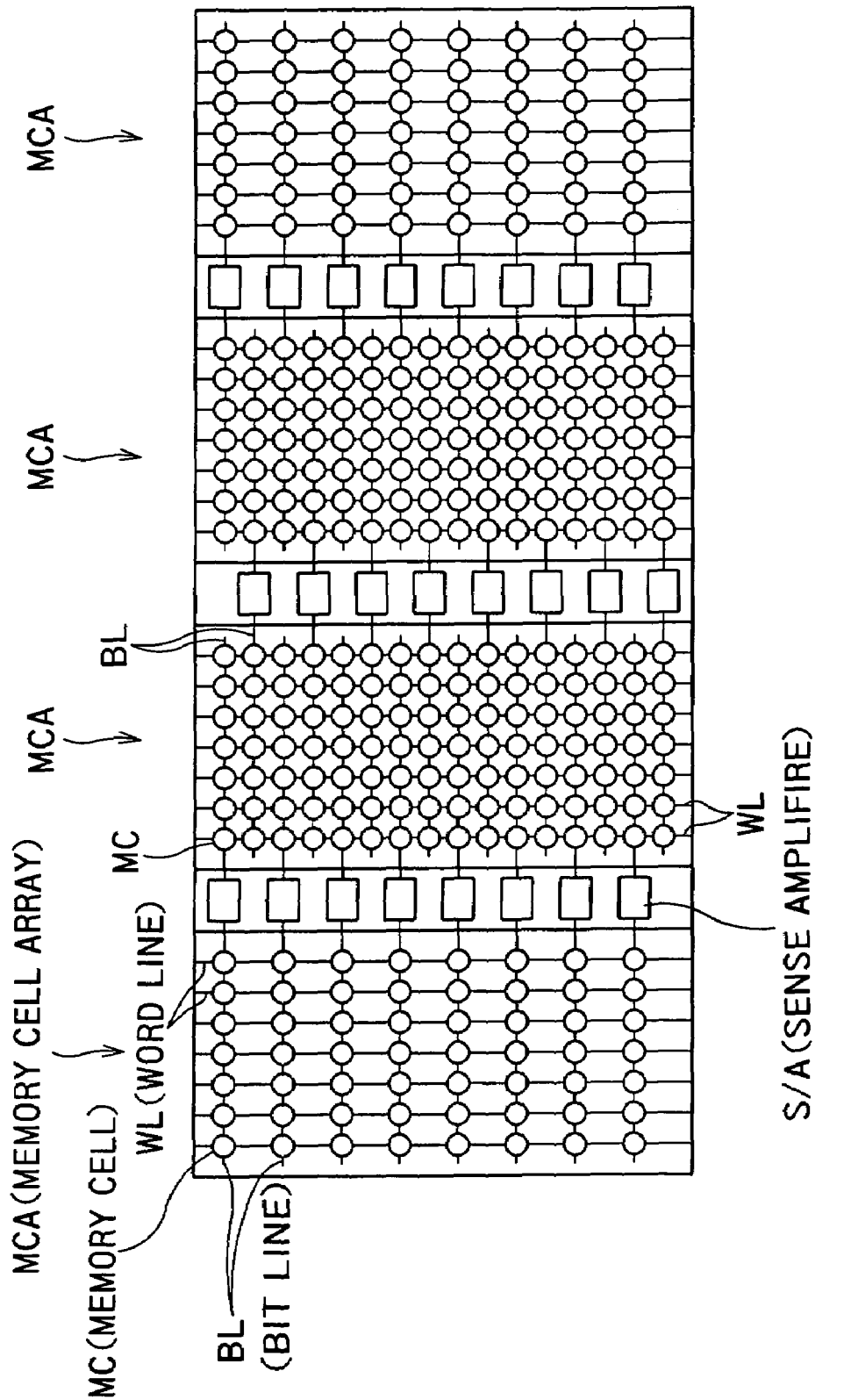
FIG. 7  DOUBLE END STRUCTURE

SEMICONDUCTOR STORAGE DEVICE

CROSS-REFERENCE TO RELATED APPLICATIONS

This application is a divisional of U.S. application Ser. No. 10/844,385, filed May 13, 2004 now U.S. Pat. No. 7,075,152, and is based upon and claims the benefit of priority from the prior Japanese Patent Application No. 2004-56298, filed on Mar. 1, 2004, the entire contents of each of which is incorporated herein by reference.

BACKGROUND OF THE INVENTION

1. Field of the Invention

This invention relates to a semiconductor storage device.

2. Related Background Art

Conventional 1T-1C (one transistor-one capacitor) type DRAM cells are getting more and more difficult to fabricate along with their progressive microminiaturization. As their substitutes, FBC memory cells have been proposed. In FBC memory cells, since a single MIS (Metal Insulator Semiconductor) FET constitutes each unit element for storing one-bit information, the area one cell occupies is small. Therefore, FBC memory cells make it possible to form a larger-capacity storage element in a unit area (see Japanese Patent Laid-open Publications JP-2003-68877, JP-2002-246571 and 2003-31693).

In conventional FBC memory cells, since individual memory cells are positioned at intersections of word lines and bit lines, when a single word line is powered, all bit lines read out data in the memory cells on the powered word line. Therefore, conventional FBC cells cannot help employing an open bit line structure.

Such an open bit line structure has to place sense amplifiers in the same intervals as those of the bit lines. As the line-to-line distance of the bit lines is reduced, it makes the layout of sense amplifiers more difficult.

Moreover, since the open bit line configuration requires a large area for sense amplifiers (i.e. the distance between adjacent memory cell arrays), it inevitably results in reducing the share of the area or volume the memory cells can occupy.

Among some open bit line configurations, there is a technique of employing a double end structure for bit lines (see FIG. 7). In the double end structure, it is sufficient to allocate one sense amplifier to every two memory bit lines in a certain memory cell array. Therefore, this technique can improve the share of memory cells to a certain extent. Nevertheless, it has not reached the fundamental solution of the issue of the share of memory cells. Furthermore, the double end structure involves the problem that, in memory cells at opposite ends of a set of arrays comprising a plurality of memory cell arrays, the number of bit lines is reduced to a half the number of bit lines in other memory cell arrays (see FIG. 7). This results in lowering the density of memory cells.

Therefore, a semiconductor storage device having a high share of memory cells by increasing a density of the memory cells and by decreasing an occupied area of sense amplifiers is desired.

SUMMARY OF THE INVENTION

A semiconductor storage device according to an embodiment of the present invention comprises a semiconductor substrate; an insulating layer formed on the semiconductor substrate; a first semiconductor layer formed on the insulating layer and insulated from the semiconductor substrate; memory cells each having a source region of a first conduction type and a drain region of the first conduction type both formed in the first semiconductor layer, and having a body of a second conduction type formed in the first semiconductor layer between the source region and the drain region, said memory cells being capable of storing data by accumulating or releasing electric charge in or from their respective body regions; memory cell lines each including a plurality of said memory cells aligned in the channel lengthwise direction; and a memory cell array including a plurality of said memory cell lines aligned in a channel widthwise direction of the memory cells, wherein said memory cells on a common memory cell line are aligned to uniformly orient the directions from their source regions to the drain regions whereas directions of said memory cells from their source regions to the drain regions on said memory cell line are opposite from those of memory cells on neighboring said memory cell lines.

A semiconductor storage device according to another embodiment of the present invention comprises a semiconductor substrate; an insulating layer formed on the semiconductor substrate; a first semiconductor layer formed on the insulating layer and insulated from the semiconductor substrate; memory cells each having a source region of a first conduction type and a drain region of the first conduction type both formed in the first semiconductor layer, and having a body of a second conduction type formed in the first semiconductor layer between the source region and the drain region, said memory cells being capable of storing data by accumulating or releasing electric charge in or from their respective body regions; memory cell lines each including a plurality of said memory cells aligned in the channel lengthwise direction; a memory cell array including a plurality of said memory cell lines aligned in the channel widthwise direction; and isolation regions surrounding individually the each of the memory cells.

BRIEF DESCRIPTION OF THE DRAWINGS

FIG. 7 is a plan view of a memory device having an open bit line configuration and a double-end structure.

DETAILED DESCRIPTION OF THE INVENTION

Some embodiments of the invention will now be explained below with reference to the drawings. These embodiments, however, should not be construed to limit the invention.

(First Embodiment)

Figure 1:
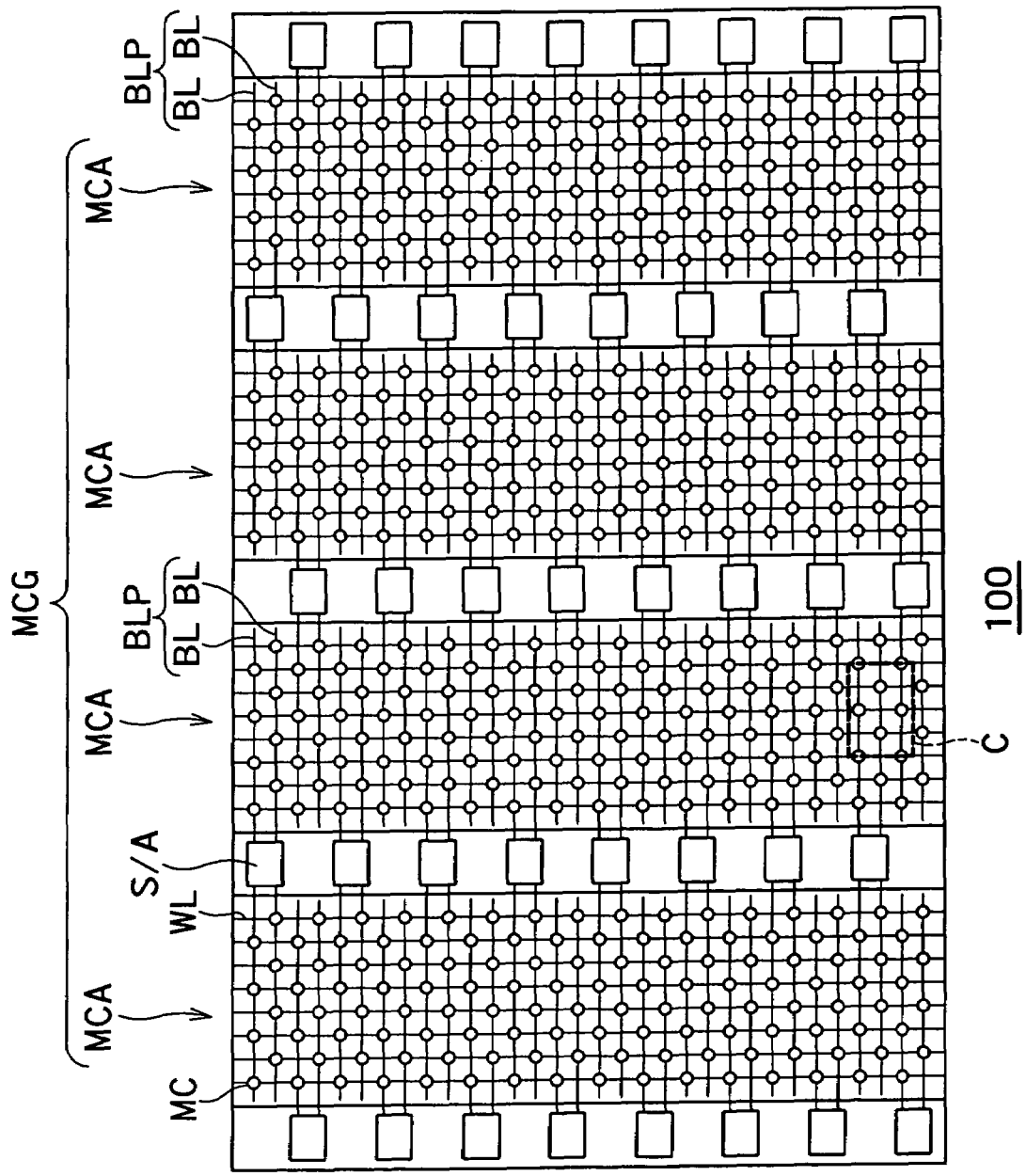
FIG. 1 is a plan view of an FBC memory device 100 according to the first embodiment of the invention.

FIG. 1 is a plan view of an FBC memory device 100 according to the first embodiment of the invention. FIG. 1 illustrates one memory array group 35 MCG including four FBC memory cell arrays MCA. Each memory cell array MCA includes a plurality of memory cells MC. Between every adjacent memory cell arrays MCA and at opposite ends of the memory array group MCG, sense amplifiers S/A are located. The sense amplifiers S/A are connected individually to bit line pairs BLP each having two adjacent bit lines BL in a common memory cell array. Sense amplifiers S/A located between adjacent memory cell arrays MCA are connected to such bit line pairs of the memory cell arrays at opposite sides thereof. That is, four bit lines BL (two bit line pairs BLP) are connected to each sense amplifier S/A. The sense amplifiers S/A have transfer gates each capable of connecting the sense amplifier S/A to one of two bit line pairs BLP at different timings.

In the first embodiment, one word line WL drives memory cells MC connected to first (or the other) bit lines BL in the respective bit line pairs BLP, and can read data from, or write data in, these memory cells exclusively.

Thus, the FBC memory cell device 100 can take the folded bit line configuration. The folded bit line configuration or structure herein pertains to the configuration in which each sense amplifier is connected to a bit line pair BLP on adjacent columns in a memory cell array at one side of the sense amplifier. In the read operation in the folded bit line configuration, each sense amplifier reads out data from one of bit lines BL of the bit line pair BLP, and uses data from the other bit line BL of the same bit line pair BLP as a reference to discriminate "0" or "1" of the read-out data.

Figure 2:
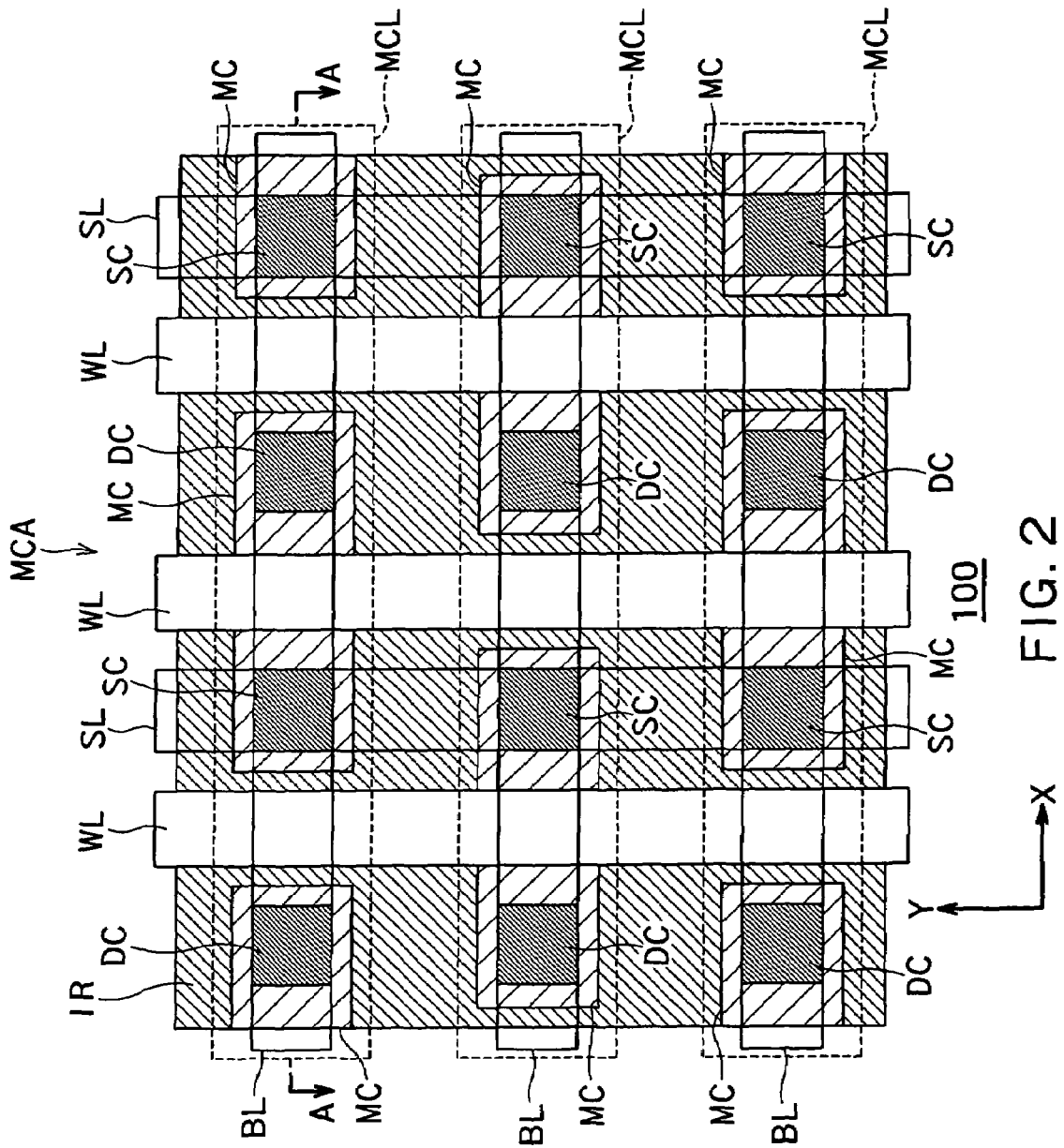
FIG. 2 is an enlarged view of the part in the broken line box C.

FIG. 2 is an enlarged view of the part in the broken line box C shown in FIG. 1. The memory cell array MCA includes a plurality of memory cells MC. Each memory cell MC has a source contact SC and a drain contact DC connected to the source region and the drain region respectively. Memory cells MC are aligned in the source-to-drain direction, i.e. in the channel lengthwise direction (X direction) to form a memory cell line MCL.

A single memory cell array MCA is made of a plurality of memory cell lines MCL aligned in the channel widthwise direction (Y direction).

In the first embodiment, memory cells of a certain memory cell line MCL are positionally off from memory cells of the neighboring memory cell line or lines MCL by ½ pitch. This arrangement of cells is herein called the "pitch-offset arrangement" for convenience. Furthermore, memory cells MC on a common memory cell line MCL are aligned to uniformly orient the directions from their source regions to the drain regions (e.g. in the X direction), whereas directions of memory cells from their source regions to the drain regions on a certain memory cell line MCL are opposite from those of memory cells on the neighboring memory cell line or lines MCL. This mode of cell arrangement is herein called the "opposed arrangement" for convenience. In addition, memory cells MC are individually surrounded by isolating regions IR such as STI (Shallow Trench Isolation) and isolated from each other. This configuration is herein called the "individual isolation arrangement" for convenience.

Bit lines BL extend along memory cell lines MCL in one-to-one correspondence with the memory cell lines MCL in the X direction, and they are electrically connected to drain regions of memory cells MC in corresponding memory cell lines MCL, Word lines WL are formed to run between sources and drains in the Y direction across memory cell lines MCL and bit lines BL. Since the memory cells are aligned in the "pitch-offset arrangement", each word line WL runs on channels of memory cells and isolating regions alternately, and intersects with memory cell lines MCL there. Source lines SL extend on source regions in parallel with word lines WL and electrically connected to source regions of memory cells MC.

Since the memory cells MC are aligned in the "pitch-offset arrangement" and in the "opposed arrangement", memory cells MC, which share a common source line SL connected to their source regions and a common word line WL running on their channels, exist only in one of every adjacent two memory cell lines MCL. In other words, it does not occur that both of two memory cells MC in adjacent memory cell lines MCL turn on simultaneously, but only one of the cells turns on, and the other remain off when a certain ward line WL is driven. This means that, when a certain word line WL is driven, only one data is read out from each bit line pair BLP comprising two adjacent bit lines BL. Thus, the FBC memory cell device 100 can take the folded bit line structure as shown in FIG. 1. That is, the "pitch-offset arrangement" and the "opposed arrangement" of the memory cells MC permit the FBC memory cell device 100 to have the folded bit line structure. The "individual isolation structure" is indispensable to realize the "opposed arrangement" and the "pitch-offset arrangement".

Figure 3:
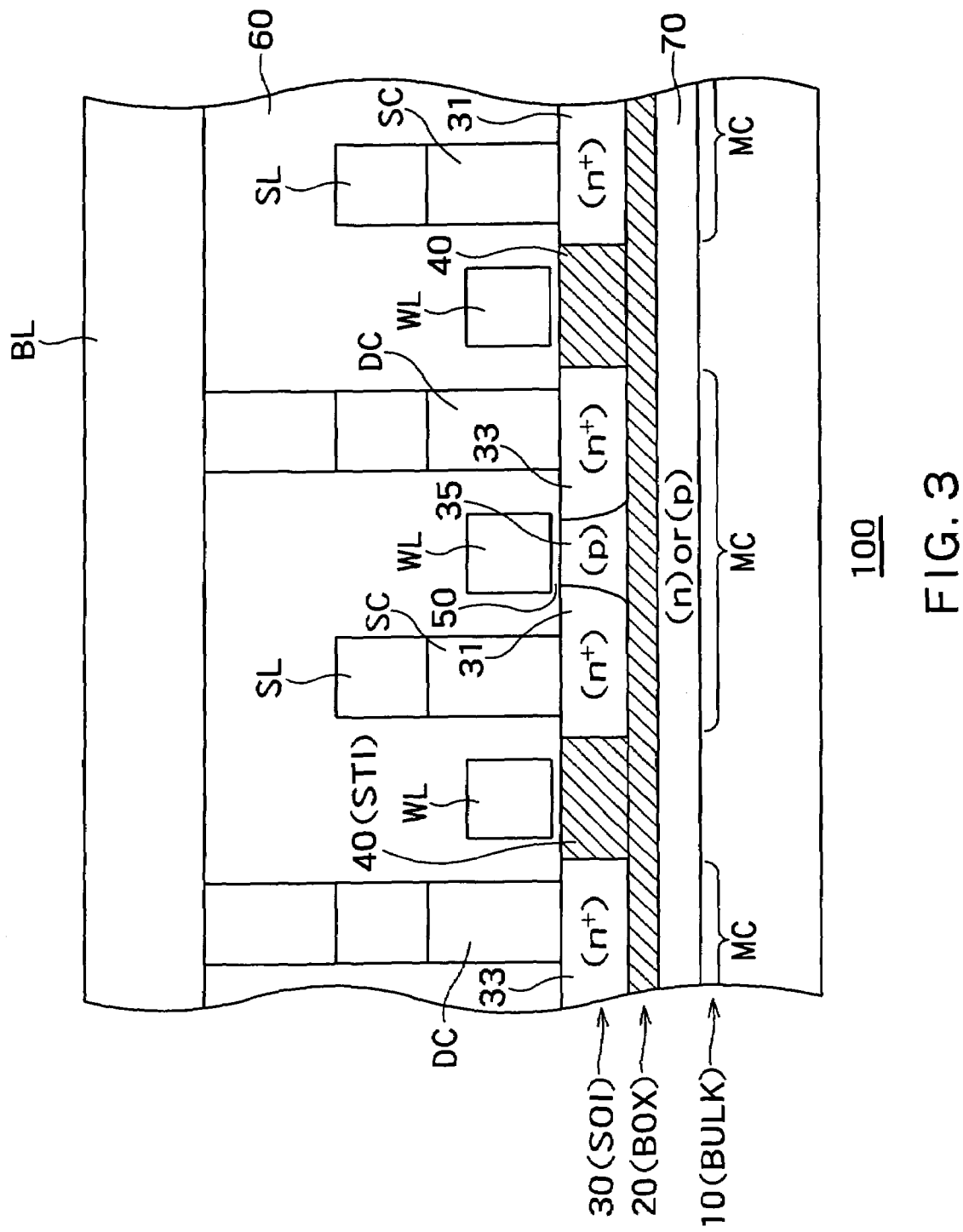
FIG. 3 is a cross-sectional view of a memory cell array MCA, taken along the A—A line of FIG. 2.

FIG. 3 is a cross-sectional view of a memory cell array MCA, taken along the A—A line of FIG. 2. The memory cell array MCA includes a p-type semiconductor substrate 10, an insulating film 20 overlying the semiconductor substrate 10, and a semiconductor layer 30 overlying the insulating film 20 and electrically insulated from the semiconductor substrate 10. The semiconductor substrate 10 and the semiconductor layer 30 are made of silicon single crystal. The insulating film 20 is, for example, a silicon oxide film. The semiconductor substrate 10, insulating film 20 and semiconductor layer 30 are herein below referred to as the bulk 10, BOX (Buried Oxide) 20 and SOI layer 30, respectively, as well.

The SOI layer 30 includes $n^+$-type source regions 31, $n^+$-type drain regions 33 and p-type floating body regions 35 (herein below simply referred to as body regions 35). The body regions 35 are electrically floating. Each memory cell comprises a source region 31, drain region 33 and a floating body region 35. In the SOI portions between every adjacent memory cells MC, isolating regions 40 are formed to reach the BOX layer 20 and electrically insulate individual memory cells MC.

A gate insulating film 50 is locally formed on the body regions 35, and word lines WL lie on the gate insulating film 50. Source contacts SC are formed on the source regions 31, and source lines SL extend on the source contacts SC. An insulating film 60 is deposited on the word lines WL and the source lines SL. On the planarized insulating film 60, bit lines BL are formed. The bit lines BL are electrically connected to the drain regions 33 via the drain contacts DC.

On the top surface of the bulk 10, an n-type or p-type plate layer 70 is formed. The plate layer 70 is connected to a plate plane PP, not shown, and determines the potential of the bulk 10.

Next explained is the principle of operation of FBC memory cells. Taking memory cells in form of N-MISFETs as shown in FIG. 3 as an example, the principle of write and read operation of the memory cells will be explained. The state having abundant holes in the body region 35 is defined as data "1" whereas the state having less holes is defined as data "0".

To write data "1", the transistor (memory cell MC) having the word line WL as its gate is made operable in the saturated state. For example, voltage of the word line WL is set to approximately 1.5 V, and voltage of the bit line BL is set to approximately 1.5 V. As a result, impact ionization is brought about near the interface between the drain region 33 and the body region 35, and a large number of electron-hole pairs are generated.

Electrons of these pairs are absorbed by the drain region 35, but the holes accumulate in the body region 35 having a lower potential. When the current value causing holes to generate by impact ionization becomes equal to the forward current of the pn junction between the body region 35 and the source region 31, the body voltage is balanced. In the balanced state, the body voltage is approximately 0.7 V.

To write data "0", voltage of the bit line BL is lowered to a negative value (for example, approximately −1.5 V). Accordingly, the pn junction between the p-type body region 35 and the n-type drain region 33 is biased forward, and the holes heretofore stored in the body region 35 are discharged to the drain region 33. As a result, the memory cell MC is set in the state of data "0".

To read out data, voltage of the word line WL is set to approximately 1.5 V, and voltage of the bit line BL is set to approximately 0.2 V. Under the condition, the transistor (memory cell MC) is made operable in the linear region, and the current difference is detected by using the body effect. This current difference makes it possible to discriminate whether the data stored in the memory cell MC is "1" or "0". The body effect is an effect changing the threshold voltage (Vth) of the transistor depending upon the number of holes stored in the body region 35.

The memory device 100 according to the first embodiment has the folded bit line configuration. Therefore, in its read operation, each sense amplifier S/A shown in FIG. 1 can read out data only from one of the bit lines BL of the bit line pair BLP. Next, the sense amplifier S/A can read out data from the other bit line of the same bit line pair BLP as a reference by driving another word line WL. If the data from the first bit line BL is larger than the reference, the data is judged to be "0". If the data is smaller than the reference, the data is judged "1".

In the write operation, by driving one word line WL, the sense amplifier S/A can write data merely in the memory cells MC connected to one of the bit lines BL of the bit line pair BLP, which is the target of the writing.

The FBC memory device according to the first embodiment has the folded bit line structure. Therefore, it is sufficient to allocate one sense amplifier S/A to every four bit lines BL. Consequently, the area occupied by the peripheral circuit or logic circuit including the sense amplifiers S/A is reduced, and the design for layout of FBC memory cells is easier. Additionally, since the area occupied by the peripheral or logic circuit decreases, the share of memory cells relative to the entire chip area increases.

In the memory device having the open bit line configuration and the double-end structure shown in FIG. 7, the cell density was low in the memory cell arrays MCA at the opposite ends. The first embodiment, however, can arrange memory cells MC by the same cell density in all memory cell arrays MCA.

In the FBC memory cell device according to the first embodiment, although the sources are not shared by adjacent memory cells MC, it is sufficient to allocate only one sense amplifier S/A to every four bit lines BL, and the cell density in the memory cell arrays MCA at the opposite ends is not reduced by half. Therefore, the share of cells in the device according to the first embodiment is higher than double-end FBC memory devices of the open bit line type, which require one sense amplifier S/A for every two bit lines BL.

The folded bit line structure is generally used in DRAMs. However, configuration of FBC memory cells is largely different from that of DRAM memory cells, conventional techniques could not employ the folded configuration in FBC memory cells and were compelled to employ the open bit line configuration.

The open bit line configuration pertains to the structure connecting sense amplifiers to bit line pairs on common columns in memory cell arrays at opposite sides of the sense amplifiers. In the read operation in the open bit line configuration, each sense amplifier reads data from respective bit lines of the both neighboring memory cell arrays, and judges whether one of data is "0" or "1" by using the other of the data as a reference.

The present Inventor has found it possible to introduce the folded bit line structure in FBC memory cells by designing FBC memory cells MC in form of the "individual isolation configuration" and by arranging the memory cells MC in the "pitch-offset arrangement" and "opposed arrangement".

(Second Embodiment)

Figure 4:
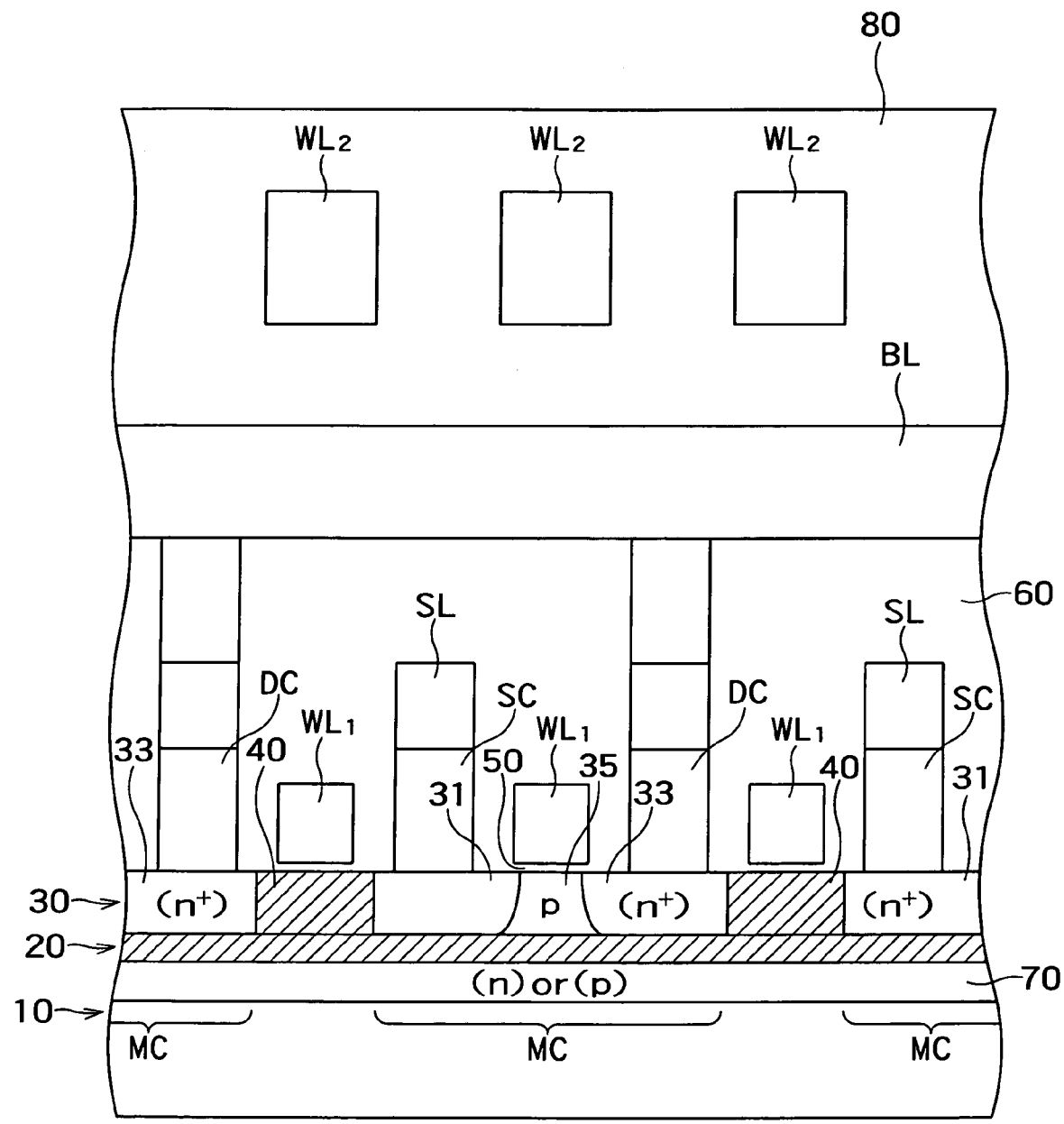
FIG. 4 is a cross-sectional view of an FBC memory device 200 according to the second embodiment of the invention.

FIG. 4 is a cross-sectional view of an FBC memory device 200 according to the second embodiment of the invention. The FBC memory device 200, in its plan view, appears equally to FIG. 2. The second embodiment is different from the first embodiment in the double-layered structure of the word lines. The FBC memory device 200 includes word lines $WL_1$ in the first layer and word lines $WL_2$ in the second layer. The word lines $WL_1$ lie on the body regions 35 whereas the word lines $WL_2$ lie on bit lines BL in parallel with the word lines $WL_1$. The word lines $WL_2$ are electrically connected to the word lines $WL_1$ at positions in predetermined intervals.

To reduce the difference in work function between the word lines $WL_1$ and the SOI layer 30, the word lines $WL_1$ are preferably made of a material of the same quality as that of the SOI layer 30. If the SOI layer 30 is made of silicon single crystal, then the word lines $WL_1$ are preferably made of doped polysilicon.

In this case, however, since doped polysilicon has a higher resistance than metals, the time constant of the word lines $WL_1$ increases, and it delays the read/write and other operations of the memory cells.

To cope with this problem, the second embodiment uses the word lines $WL_2$ made of a metal in a different layer from the word lines $WL_1$ and thereby reduces the time constant of the entire word lines. In this manner, read/write and other operations of the memory cells MC can be speeded up.

(Third Embodiment)

Figure 5:
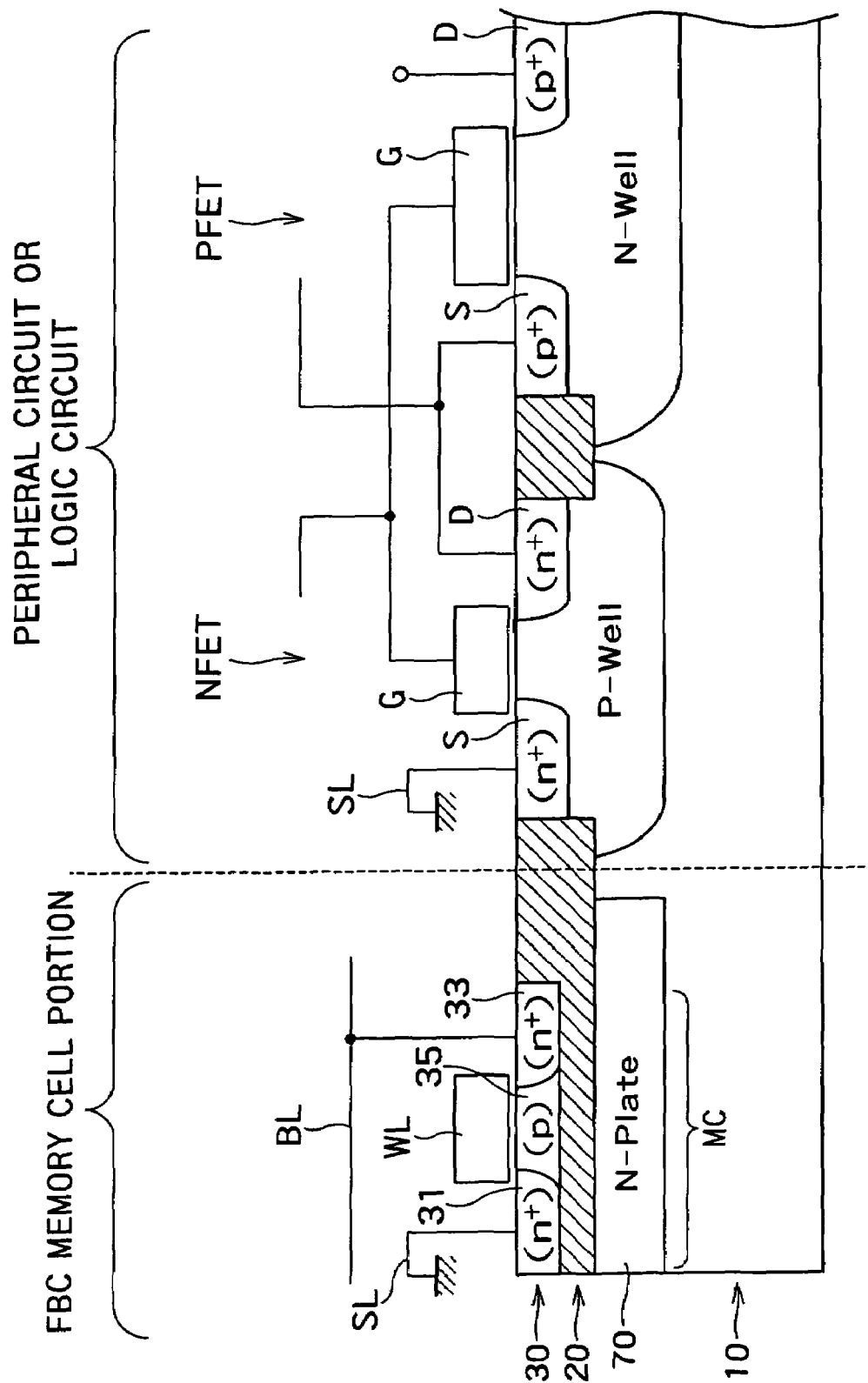
FIG. 5 is a cross-sectional view of an FBC memory device 300 according to the third embodiment of the invention.

FIG. 5 is a cross-sectional view of an FBC memory device 300 according to the third embodiment of the invention. In this embodiment, the FBC memory cell portion is formed in SOI, and the peripheral circuit or logic circuit is formed in the bulk. In the third embodiment, the FBC memory cell portion may be configured according to the first or the second embodiment.

In the FBC memory cell portion, a BOX layer 20 is formed on a bulk 10, and a SOI layer 30 is formed on the BOX layer 20. Since memory cells MC are formed in the SOI layer 30, they are electrically insulated from the bulk 10. Thus, the body regions 35 can float electrically.

The BOX layer 20 is not formed in the peripheral circuit or logic circuit, and p-type FETs and n-type FETs are formed in a well diffusion layer formed in the bulk 10. Although FIG. 5 shows only one p-type FET and only one n-type FET, a number of these FETs can be combined to make a logic circuit necessary for the peripheral circuit or logic circuit.

To prepare the semiconductor substrate locally having the SOI layer (herein below called the local SOI substrate), SIMOX (Separation by IMplanted OXygen) (first method) may be used. Alternatively, after the SOI substrate is prepared by a bonding method and locally removing the BOX layer from the peripheral circuit or logic circuit, silicon single crystal may be grown on that portion by epitaxial growth (second method).

The specification of the crystalline quality of silicon in the peripheral circuit of logic circuit is usually less strict than that of the memory cell portion. Therefore, the second method that epitaxially grows silicon in the peripheral circuit or logic circuit will be relatively easy to employ.

Next explained are effects of the third embodiment. FBC memory is normally formed on a SOI substrate. Therefore, it is desirable to form the logic circuit for controlling the FBC memory and the peripheral circuit of the FBC memory as well on the common SOI substrate. However, most of the logic circuits for controlling memory cells of their peripheral circuits is normally designed as being formed on bulk silicon. Pieces of information about layout designs are stocked as library, and appropriate one is selected to realize an operation that meets the specification of the product.

If the design information of bulk silicon is applied to a SOI substrate, floating bodies are formed in the logic circuit or peripheral circuit. As a result, electric charges accumulate in the floating bodies, and make the characteristics instable. That is, hysteresis appears in the logic circuit or peripheral circuit. For example, response of a transistor upon applying certain voltages to its three terminals (drain, source and gate) depends upon the precedent voltages having been applied to these terminals before.

Therefore, in case of forming the peripheral circuit or logic circuit on a SOI substrate, the circuit designer has to consider the hysteresis when designing the circuit to assure its proper operation. Otherwise, it is necessary to provide a body contact to fix the voltage of the body region 30 to a constant voltage value. As a result, the designer cannot use the layout library stocked heretofore when he/she actually designs the circuit, and must change design information in the layout library to form the logic circuit or peripheral circuit on the SOI substrate.

According to the third embodiment, since the peripheral circuit or logic circuit is formed in the bulk 10, the circuit designer needs not worry about hysteresis and can use the existing layout library when designing the circuit. Therefore, layout of SoC (System On Chip), for example, can be designed relatively easily.

(Fourth Embodiment)

Figure 6:
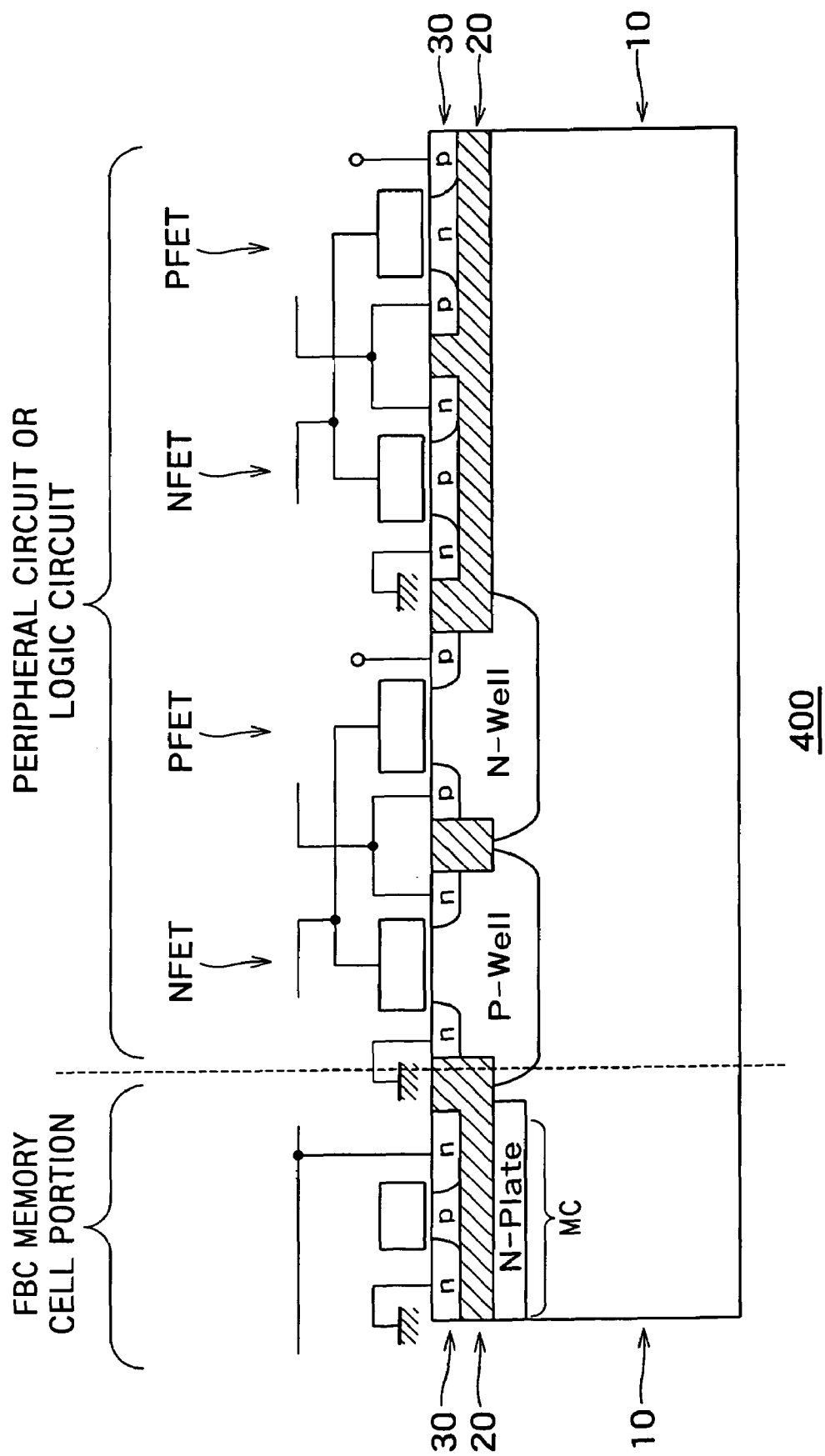
FIG. 6 is a cross-sectional view of an FBC memory device 400 according to the fourth embodiment of the invention.

FIG. 6 is a cross-sectional view of an FBC memory device 400 according to the fourth embodiment. The fourth embodiment is different from the third embodiment in that a part of the peripheral circuit or logic circuit is formed on the SOI layer 30. In the fourth embodiment, the FBC memory cell portion may have the structure according to the first or second embodiment.

Since the peripheral circuit or logic circuit is partly formed on the SOI layer 30, design information of this part of the peripheral circuit or logic circuit has to be changed to design information different from the existing layout library. However, the peripheral circuit or logic circuit formed on the SOI layer 30 can operate very quickly. Regarding the other part of the peripheral circuit or logic circuit, which is formed on the bulk 10, the existing layout library can be used upon designing the circuit.

As such the fourth embodiment makes it possible to selectively form a part of the peripheral circuit or logic circuit of SoC (System On Chip), for example, on the SOI layer 30 or the bulk 10.

What is claimed is:

1. A semiconductor storage device comprising:
    a semiconductor substrate;
    an insulating layer formed on the semiconductor substrate;
    a first semiconductor layer formed on the insulating layer and insulated from the semiconductor substrate;
    memory cells each having a source region of a first conduction type and a drain region of the first conduction type both formed in the first semiconductor layer, and having a body of a second conduction type formed in the first semiconductor layer between the source region and the drain region, said memory cells being capable of storing data by accumulating or releasing electric charge in or from their respective body regions;
    memory cell lines each including a plurality of said memory cells aligned in the channel in a lengthwise direction;
    a memory cell array including a plurality of said memory cell lines aligned in the channel in a widthwise direction;
    isolation regions individually surrounding each of the memory cells;
    bit lines provided for each of the memory cell lines and extending along with the memory cell lines, respectively;
    word lines provided on the body regions and insulated from said body regions, said word lines extending in the channel in the widthwise direction; and
    sense amplifiers located between adjacent memory cell arrays and located at opposite ends of a memory array group including a plurality of the memory cell arrays, one of the sense amplifiers being connected to a bit line pair which is composed of two bit lines in a certain memory cell array, one of the two bit lines transmitting reference data used to sense data on another of the two bit lines.

2. The semiconductor storage device according to claim 1, wherein sense amplifiers are provided for each two bit line pairs on one end of the certain memory cell array,
    the two bit line pairs adjacent to each other in the certain memory cell array are connected to the sense amplifiers which are located at opposite sides of the certain memory cell array, respectively.

3. The semiconductor storage device according to claim 1, wherein said semiconductor storage device has a folded bit line structure.

4. The semiconductor storage device according to claim 1 further comprising:
    a logic circuit formed on the semiconductor substrate, said logic circuit including sense amplifiers to control the memory cells.

5. The semiconductor storage device according to claim 4 wherein, a logic circuit is formed on the first semiconductor layer.

* * * * *